United States Patent
Buynoski et al.

(10) Patent No.: US 6,518,154 B1
(45) Date of Patent: Feb. 11, 2003

(54) METHOD OF FORMING SEMICONDUCTOR DEVICES WITH DIFFERENTLY COMPOSED METAL-BASED GATE ELECTRODES

(75) Inventors: Matthew S. Buynoski, Palo Alto, CA (US); Qi Xiang, San Jose, CA (US); Paul R. Besser, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 9 days.

(21) Appl. No.: 09/813,310

(22) Filed: Mar. 21, 2001

(51) Int. Cl.[7] ................ H01L 21/3205; H01L 21/4763
(52) U.S. Cl. ............... 438/585; 438/199; 438/224; 438/228; 438/592
(58) Field of Search .................. 438/154, 199, 438/218, 219, 223, 224, 227–229, 585, 592; 257/204, 206, 369, 371, 412, 413

(56) References Cited

U.S. PATENT DOCUMENTS 5,656,519 A * 8/1997 Mogami ............ 438/230
6,204,103 B1 * 3/2001 Bai et al. ............ 438/224
6,410,376 B1 * 6/2002 Ng et al. ............ 438/199
2002/0008294 A1 * 1/2002 Hayashi et al. ......... 257/413

* cited by examiner

Primary Examiner—Matthew Smith
Assistant Examiner—Craig P. Lytle

(57) ABSTRACT

MOS transistors and CMOS devices comprising a plurality of transistors including metal-based gate electrodes of different composition are formed by a process comprising: depositing a first blanket layer of a first metal on a thin gate insulator layer extending over first and second active device (e.g., a MOS transistor) precursor regions of a semiconductor substrate; selectively forming at least one masking layer segment on the first blanket layer overlying selective ones of the MOS transistor precursor regions; depositing a second blanket layer of a second metal or semi-metal, or silicon, over the thus-formed structure; effecting alloying or silicidation reaction between contacting portions of the first and second blanket layers overlying the other ones of the transistor precursor regions; exposing and selectively removing the masking layer segment; and simultaneously patterning the alloyed and unalloyed/unsilicided portions of the first blanket layer to form metal-based gate electrodes of different composition. The invention also includes MOS and CMOS devices comprising differently composed metal-based gate electrodes.

20 Claims, 4 Drawing Sheets

METHOD OF FORMING SEMICONDUCTOR DEVICES WITH DIFFERENTLY COMPOSED METAL-BASED GATE ELECTRODES

CROSS-REFERENCE TO RELATED APPLICATION

This application contains subject matter similar to subject matter disclosed in copending U.S. patent application Ser. No. 09/781,436, filed on Feb. 13, 2001.

FIELD OF THE INVENTION

The present invention relates to methods of manufacturing semiconductor devices including a plurality of active device regions each having a gate electrode, e.g., CMOS devices comprised of one or more of each of NMOS and PMOS transistors. More specifically, the present invention relates to methods of manufacturing CMOS devices wherein the gate electrodes of the various transistors are formed of different metal-based, electrically conductive materials, and to the devices thereby produced. The present invention has particular utility in the manufacture of high integration density semiconductor devices employing design rules of 0.20 µm and below, e.g., 0.15 µm and below.

BACKGROUND OF THE INVENTION

The escalating requirements for high density and performance (e.g., transistor and circuit speeds) associated with ultra-large scale integration ("ULSI") devices necessitate design rules for component features of 0.20 µm and below, e.g., 0.15 µm and below, such as source, drain, and gate regions and electrodes therefor formed in or on a common semiconductor substrate, challenges the limitations of conventional materials and manufacturing processes and necessitates use of alternative materials and development of new methodologies therefor.

An example of the above-mentioned challenge based upon the limitations inherent in conventional materials and methodologies utilized in the semiconductor integrated circuit ("IC") industry is the use of polysilicon for forming gate electrodes of metal-oxide-semiconductor ("MOS") transistors. Polysilicon is conventionally employed as a gate electrode material in MOS transistors in view of its good thermal stability, i.e., ability to withstand high temperature processing. More specifically, the good thermal stability of polysilicon-based materials permits high temperature annealing thereof during formation/activation of implanted source and drain regions. In addition, polysilicon-based materials advantageously block implantation of dopant ions into the underlying channel region of the transistor, thereby facilitating formation of self-aligned source and drain regions after gate electrode deposition/patterning is completed.

However, polysilicon-based gate electrodes incur a number of disadvantages, including, inter alia: (1) as device design rules decrease to below about 0.20 µm, polysilicon gates are adversely affected by poly depletion, wherein the effective gate oxide thickness ("EOT") is increased. Such increase in EOT can reduce performance by about 15% or more; (2) polysilicon-based gate electrodes have higher resistivities than most metal or metallic materials and thus devices including polysilicon as electrode or circuit materials operate at a much slower speed than equivalent devices utilizing metal-based materials. Further, a significant portion of the voltage applied to the gate during operation is dropped in the polysilicon due to the poor conductivity of silicon. As a consequence, in order to compensate for the higher resistance, polysilicon-based materials require suicide processing in order to decrease their resistance and thus increase the operational speeds of polysilicon-based devices to acceptable levels; (3) use of polysilicon-based gates necessitates ion implantation of different dopant atoms for p-channel transistors and n-channel transistors formed in a CMOS device, which different dopant species are required for the p-channel and n-channel transistors to have compatible threshold voltages ("$V_t$"). Disadvantageously, the threshold adjust implant is of sufficiently high doping concentration as to adversely impact the mobility of charge carriers in and through the channel region; and (4) polysilicon-based gate electrodes are less compatible with high dielectric constant ("high-k") materials (i.e., >5, preferably >20) which are desirable for use as gate oxide layers, than are metal-based gate electrodes.

In view of the above-described drawbacks and disadvantages associated with the use of polysilicon-based materials as gate electrodes in MOS and CMOS transistor devices, several process schemes have been proposed for making self-aligned MOS and/or CMOS transistor devices utilizing metal-based gate electrode materials.

Metal or metal-based gate electrode materials for use in MOS and/or CMOS devices offer a number of advantages vis-à-vis conventional polysilicon-based materials, including: (1) since many metal materials are mid-gap work function materials, the same metal gate material can, under favorable circumstances, function as a gate electrode for both n-channel and p-channel transistors in a CMOS process without disadvantageously requiring threshold voltage ($V_t$) adjust implants, while maintaining $V_t$ at compatible levels; (2) metal gate electrodes have a greater conductivity than polysilicon electrodes; (3) unlike polysilicon-based gate electrodes, metal gate electrodes do not suffer from polysilicon depletion which alters the EOT of an MOS transistor, thereby affecting the performance of the MOS device (i.e., thinner EOTs, while possibly resulting in an increased leakage current, result in faster operating devices); (4) metal gate MOS devices are advantageous for use in fully-depleted silicon-on-insulator ("SOI") devices since $V_t$ of these devices can be more accurately controlled; and (5) metal gate electrodes are more compatible with high-k dielectrics than conventional polysilicon processing.

The use of metal or metallic materials as replacements for polysilicon-based materials as gate electrodes in MOS and/or CMOS devices incurs several difficulties, however, which difficulties must be considered and overcome in any metal-based gate electrode process scheme, including: (1) metal and/or metal-based gates cannot withstand the higher temperatures and oxidative ambients which conventional polysilicon-based gate electrode materials are capable of withstanding; (2) several candidate metals or metallic materials for use as gate electrodes do not exhibit adequate adhesion in film form to surrounding layers of different materials when these metals or metallic materials are patterned to very small geometries; (3) some metal or metallic films are difficult to lithographically pattern and etch via conventional processing techniques because etching thereof may significantly damage underlying oxides, thereby adversely affecting device performance; (4) thermal processing subsequent to metal gate electrode formation may result in instability and degradation of the gate oxide due to chemical interaction between the metal and oxide at the metal gate-gate oxide interface; and (5) high thermal expansion coefficients of metals with respect to silicon can lead to undesirably high stress levels.

A conventional process scheme for forming silicon-based MOS transistors of different channel conductivity type (i.e., NMOS and PMOS transistors) in or on a common semiconductor substrate, as in CMOS devices, is schematically illustrated in FIGS. 1(A)–1(H). As shown in FIG. 1(A), a preliminary structure 10 is provided which comprises at least one field oxide region 115 or other type conventional isolation means (such as shallow trench isolation ("STI")) formed in semiconductor substrate 100, typically of monocrystalline Si, to electrically separate p-type well regions 101 and n-type well regions 102 (referred to hereinafter as active device or transistor "precursor regions") formed therein, e.g., by conventional dopant diffusion or implantation. Preliminary structure 10 further includes a thin gate insulator layer 105, typically a silicon oxide layer, formed in contact with the upper surface of substrate 100, as by thermal oxidation.

Referring now to FIG. 1(B), a layer 110 of an electrically conductive gate electrode material, typically of heavily-doped polysilicon, is formed over the thin gate insulator layer 105 and patterned, as by conventional photolithographic masking and etching techniques, to form a pair of layer stacks 105/110 overlying respective portions of the surface area of each of the oppositely doped regions 101, 102. As next shown in FIG. 1(C), a first patterned photoresist mask $M_1$ is then formed over n-type region 102 and its associated layer stack 105/110 and p-type region 101 and its associated layer stack 105/110 are subjected to a relatively low energy/low dosage ion implantation of n-type dopant impurities $N_{LDD}$ to form lightly-doped regions 120, termed "source/drain extensions".

Adverting to FIG. 1(D), first mask $M_1$ is then removed, p-type region 101 and its associated layer stack 105/110 are masked with a second patterned photoresist mask $M_2$, and n-type region 102 and its associated layer stack 105/110 thereafter subjected to a relatively low energy/low dosage ion implantation of p-type dopant impurities $P_{LDD}$ to form lightly-doped source/drain extensions 125.

Next, as shown in FIG. 1(E), sidewall spacers 130 are formed on opposing side surfaces of each of the gate insulator/gate electrode layer stacks 105/110, e.g., by depositing a blanket layer of a dielectric material, such as a silicon nitride, followed by anisotropic etching to selectively remove laterally extending portions of the blanket layer.

Referring now to FIG. 1(F), a third photoresist mask $M_3$ is then formed over n-type region 102 and its associated layer stack 105/110 previously implanted with p-type dopant impurities. P-type region 101 and its associated layer stack 105/110 are then subjected to a second, relatively high energy/high dosage ion implantation for implanting n-type dopant impurities $N_{S/D}$, to form more heavily-doped, deeper source/drain regions 135, which include the previously formed, more lightly-doped, shallower source/drain extensions 120.

Adverting to FIG. 1(G), third mask $M_3$ is then removed, and p-type region 101 and its associated layer stack 105/110 previously implanted with n-type dopant impurities are then masked with fourth patterned photoresist mask $M_4$. N-type region 102 and its associated layer stack 105/110 are thereafter subjected to relatively high energy/high dosage ion implantation for implanting p-type dopant impurities $P_{S/D}$ to form more heavily-doped, deeper source/drain regions 140, which include the previously formed, more lightly-doped, shallower source/drain extensions 125. Fourth mask $M_4$ is then removed, resulting in the structure shown in FIG. 1(H), to which electrical contacts to each of the source/drain regions 135, 140 and gate electrodes 110 are formed by means of subsequent, conventional processing steps (not shown for brevity).

As indicated above, the polysilicon gate electrodes 110 of the above-illustrated conventional process sequence are advantageously replaced with metal or metal-based gate electrode materials when manufacturing submicron-dimensioned MOS transistors and CMOS devices comprised of a plurality of NMOS and PMOS transistors. Moreover, in some favorable or fortuitous instances, the same metal or metal-based material can function as the gate electrode for both the n-channel (i.e., NMOS) and p-channel (i.e., PMOS) transistors of a CMOS device without requiring transistor threshold voltage ($V_t$) implants, while maintaining the latter at compatible levels. However, the use of the same metal or metal-based material for both the NMOS and PMOS transistors of a CMOS device is neither necessarily practical or desirable, as for example, in instances where the electrical performance characteristics of the various NMOS and PMOS transistors of the desired CMOS (or other type MOS-based device) device must be individually tailored or grouped for use in a particular application. As a consequence, the use of different metal or metal-based materials as gate electrodes in MOS transistor-based devices, such as CMOS devices, has been proposed as a means for tailoring the performance characteristics or properties of individual transistors or groups/types of transistors of such devices. Disadvantageously, however, the use of different metals as gate electrode materials in such plural MOS-containing devices is problematic because of the above-described difficulties associated with various candidate metals, including, inter alia, inability to achieve good adhesion when in film form and/or patterned to very small geometries, as well as damage to the underlying thin gate insulator layer resulting from photolithographic patterning and etching according to conventional techniques and methodologies.

Accordingly, there exists a need for improved methodology for performing simple, reliable, rapid, and cost-effective formation of plural MOS transistor-containing devices, including CMOS devices, wherein different metal and/or metal-based materials are utilized for forming gate electrodes to various types of transistors, such as NMOS and PMOS transistors of a CMOS device, which methodology avoids the drawbacks and disadvantages associated with the conventional techniques and provides, inter alia, metal or metal-based gate MOS transistors and CMOS devices having precisely tailored transistor characteristics.

The present invention, wherein a first blanket layer of a first gate electrode metal is initially formed over and in electrical contact with a thin gate insulator layer overlying a plurality of spaced-apart, electrically isolated active device (e.g., MOS transistor) precursor regions formed on or within a surface of a semiconductor substrate, a hard mask layer segment is then selectively formed on portions of the first blanket layer overlying preselected ones of the active device precursor regions, a second blanket layer of a second, alloying metal or silicon is formed over the thus-formed structure, alloying of the first and second metals or silicidation reaction of the first metal is effected at selected ones of the active device precursor regions where the first and second metal layers or the first metal and silicon layers are in contact, the unalloyed or unsilicided portions of the second blanket layer and the hard mask layer segments are removed, and the resultant structure patterned to form two types of metal-based gate electrodes, i.e., a first type composed of the first metal and a second type composed of an alloy of the first and second metals or of an electrically conductive silicide of the first metal, effectively addresses and solves the need for improved methodology for use in the manufacture of high-quality, submicron-dimensioned, metal-based gate electrode MOS transistor-based and CMOS semiconductor devices having precisely tailored/controlled transistor characteristics. Further, the methodology provided by the instant invention can be implemented rapidly and in a cost-effective manner utilizing conventional processing techniques and apparatus. Finally, the methodology afforded by the present invention enjoys diverse utility in the manufacture of numerous and various types of semiconductor devices and/or components utilizing metal-based gate electrodes.

DISCLOSURE OF THE INVENTION

An advantage of the present invention is an improved method for manufacturing semiconductor devices including at least two metal-based gate electrodes of different composition.

Another advantage of the present invention is an improved method for manufacturing a device comprising at least a pair of MOS transistors, wherein the gate electrodes of each of the transistors are formed of a different metal-based material.

Yet another advantage of the present invention is an improved method for manufacturing semiconductor devices, such as CMOS devices comprising at least one NMOS transistor ant at least one PMOS transistor, wherein each transistor type includes a differently composed, metal-based gate electrode.

Still another advantage of the present invention is an improved semiconductor device, such as a CMOS device comprised of NMOS and PMOS transistors, having differently composed, metal-based gate electrodes to transistors of different conductivity type.

Additional advantages and other features of the present invention will be set forth in the description which follows and in part will become apparent to those having ordinary skill in the art upon examination of the following or may be learned from the practice of the invention. The advantages of the present invention may be realized as particularly pointed out in the appended claims.

According to an aspect of the present invention, the foregoing and other advantages are obtained in part by a method of manufacturing a semiconductor device including at least two metal-based gate electrodes of different composition, comprising the steps of:
  (a) providing a semiconductor substrate having a surface;
  (b) defining at least first and second spaced-apart, electrically isolated, active device precursor regions on or within the surface of the semiconductor substrate;
  (c) forming a first metal-based gate electrode in overlying electrical contact with the first active device precursor region, the first metal-based gate electrode comprised of a first metal; and
  (d) forming a second metal-based gate electrode in electrical contact with the second active device precursor region, the second metal-based gate electrode comprised of an alloy of the first metal with a second metal or semi-metal or of an electrically conductive silicide of the first metal.

According to embodiments of the present invention, step (b) comprises defining transistor precursor regions, e.g., transistor precursor regions of different conductivity type such as NMOS and PMOS transistor precursor regions for a CMOS device.

According to further embodiments of the present invention, step (d) comprises forming an alloy of the first metal with the second metal or semi-metal or forming a silicide of the first metal.

According to still further embodiments of the present invention, step (c) comprises forming the first metal-based gate electrode from a first metal selected from the group consisting of molybdenum (Mo), tungsten (W), titanium (Ti), platinum (Pt), and aluminum (Al); and step (d) comprises forming the second metal-based gate electrode from an alloy of the first metal with a second metal or semi-metal selected from elements in Groups IIA–VIA, IB, IIIB–VIIIB of the Periodic Table of the elements (Sargent-Welch Co, 1968) and lanthanide series elements, or from a silicide of the first metal.

According to particular embodiments of the present invention,
  step (b) includes steps of:
    (i) forming at least one dielectric isolation region extending for a depth below the surface of the semiconductor substrate to define the at least first and second spaced-apart active device precursor regions; and
    (ii) forming a thin gate oxide layer on at least portions of the substrate surface corresponding to the at least first and second spaced-apart active device precursor regions;
  step (c) includes steps of:
    (i) forming a first blanket layer of the first metal over the substrate surface in electrical contact with each of the first and second spaced-apart, active device precursor regions; and
    (ii) selectively forming a layer of a hard mask material on a portion of the first blanket layer of the first metal overlying the first active device precursor region; and
  step (d) includes steps of:
    (i) forming a second blanket layer of a second metal or semi-metal or silicon (Si) overlying the second active device precursor region and the layer of hard mask material overlying the first active device precursor region; and
    (ii) effecting alloying or silicidation reaction of the portion of the second blanket layer in overlying contact with the portion of the first blanket layer in electrical contact with the second active device precursor region.

According to embodiments of the present invention, the method further includes the steps of:
  (e) removing unalloyed or unsilicided portions of the second blanket layer to expose the layer of hard mask material overlying the first active device precursor region;
  (f) removing the layer of hard mask material to expose the first blanket layer of the first metal overlying the first active device precursor region; and
  (g) selectively removing the portions of the first blanket layer of the first metal overlying the first active device precursor region and the alloyed or silicided portions of the first blanket layer of the first metal overlying the second active device precursor region to form respective first and second metal-based gate electrodes of different composition.

According to embodiments of the present invention, the method comprises the still further step of:

(h) forming source and drain regions in each of the first and second active device precursor regions.

According to another aspect of the present invention, a method of manufacturing a Si-based semiconductor device comprised of at least first and second MOS transistors, wherein the first MOS transistor includes a first gate electrode comprised of a first metal and the second MOS transistor includes a second gate electrode comprised of an alloy of the first metal with a second metal or semi-metal or a silicide of the first metal, comprises the steps of:

(a) providing a Si-based substrate having a surface;

(b) defining on or within the substrate surface at least first and second spaced apart, electrically isolated, transistor precursor regions where the first and second MOS transistors are to be formed;

(c) forming a first blanket layer of the first metal over the substrate surface in electrical contact with each of the first and second spaced-apart, transistor precursor regions;

(d) selectively forming a layer of a hard mask material on a portion of the first blanket material overlying the first transistor precursor region;

(e) forming a second blanket layer of a second metal or semi-metal or silicon (Si) overlying the second transistor precursor region and the layer of hard mask material overlying the first transistor precursor region;

(f) effecting alloying or silicidation reaction of the portion of the second blanket layer in overlying contact with the portion of the first blanket layer in electrical contact with the second transistor precursor region;

(g) removing unalloyed or unsilicided portions of the second blanket layer to expose the layer of hard mask material overlying the first transistor precursor region;

(h) removing the layer of hard mask material to expose the first blanket layer of the first metal overlying the first transistor precursor region; and (i) selectively removing portions of the first blanket layer of the first metal overlying the first transistor precursor region and the alloyed or silicided portions of the first blanket layer of the first metal overlying the second transistor precursor region to form respective first and second metal-based gates of different composition; and (j) forming a pair of source and drain regions in each of the first and second transistor precursor regions.

According to embodiments of the present invention, step (c) comprises forming the first blanket layer from a first metal selected from the group consisting of Mo, W, Ti, Pt, and Al; and step (e) comprises forming the second blanket layer from a second metal or semi-metal selected from elements in Groups IIA–VIA, IB, IIIB–VIIIB of the Periodic Table and lanthanide series elements, or from Si.

According to further embodiments of the present invention, step (b) comprises defining at least first and second transistor precursor regions of opposite conductivity type for forming therein NMOS and PMOS transistors of a CMOS device; and wherein the first metal and second metal or semi-metal, or the first metal and Si utilized in performing steps (c) and (e), respectively, are selected on the basis of the conductivity types of the first and second MOS transistors.

According to particular embodiments of the present invention, step (b) includes steps of:

(i) forming at least one dielectric isolation region extending for a depth below the surface of the Si-based semiconductor substrate to define the at least first and second spaced-apart transistor precursor regions; and (ii) forming a thin gate oxide layer on at least portions of the Si-based semiconductor substrate surface corresponding to the at least first and second spaced-apart transistor precursor regions.

According to still other embodiments of the present invention, step (j) comprises forming the pairs of source and drain regions in each of said transistor precursor regions by ion implantation of appropriate conductivity type dopant species.

According to yet another aspect of the present invention, a semiconductor device comprises:

a semiconductor substrate including a surface having formed therein or thereon at least one first active device region and at least one second active device region, the first and second active device regions including respective first and second metal-based gate electrodes, the first metal-based gate electrode being comprised of a first metal and the second metal-based gate electrode being comprised of an alloy of the first metal with a second metal or semi-metal, or of an electrically conduct silicide of the first metal.

According to embodiments of the present invention, the substrate is Si-based, the first active device region comprises a first conductivity type MOS transistor, the second active device region comprises a second, opposite conductivity type MOS transistor, and the semiconductor device is a CMOS device.

According to further embodiments of the present invention, the first metal-based gate electrode comprises a first metal selected from the group consisting of Mo, W, Ti, Pt, and Al; and the second metal-based gate electrode comprises an alloy of the first metal with a second metal or semi-metal selected from elements in Groups IIA–VIA, IB, IIIB–VIIIB of the Periodic Table and lanthanide series elements, or the first metal-based gate electrode comprises a first metal selected from the group consisting of Mo, W, Ti, Pt, and Al; and the second metal-based gate electrode comprises a silicide of the first metal.

Additional advantages and aspects of the present invention will become apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, and in which like reference numerals are employed throughout to designate similar features, wherein.

DESCRIPTION OF THE INVENTION

The present invention is based upon the discovery that submicron-dimensioned MOS transistor and CMOS devices comprised of NMOS and PMOS transistors which include metal-based gate electrodes of different composition can be readily formed by a process which avoids the aforementioned drawbacks, disadvantages, and difficulties associated with the use of thin metal films patterned into the very small geometries required for manufacturing such devices. According to the invention, a first metal-based gate electrode material is composed of a first metal and a second metal-based, in-laid gate electrode material is composed of an alloy of the first metal with a second metal or of an electrically conductive silicide of the first metal. A key feature, i.e., advantage, of the present invention is elimination of the requirement for performing separate patterning steps for each of the layers of different metal-based gate electrode materials. The elimination of separate steps for patterning of the layers of differently composed metal-based gate electrode materials is accomplished by use of separate blanket deposition processes for forming overlying first and second blanket layers of first and second metals (or a first layer of a metal and a second layer of silicon), together with selective formation of a hard mask layer between the first and second blanket layers at selected locations where alloying or silicidation reaction of the first and second blanket layers is to be prevented, as over preselected active device or transistor precursor regions. Another key feature of the present invention is patterning for forming the differently composed, metal-based gate electrodes by simultaneous removal of superfluous/unnecessary portions of the first metal and alloyed/silicided layers. As a consequence of the inventive methodology, high-quality, MOS transistors and CMOS devices composed of N-MOS and PMOS transistors having precisely tailored performance characteristics for use in a particular application can be readily and cost-effectively fabricated with differently composed metal-based gate electrodes.

Figure 1A:
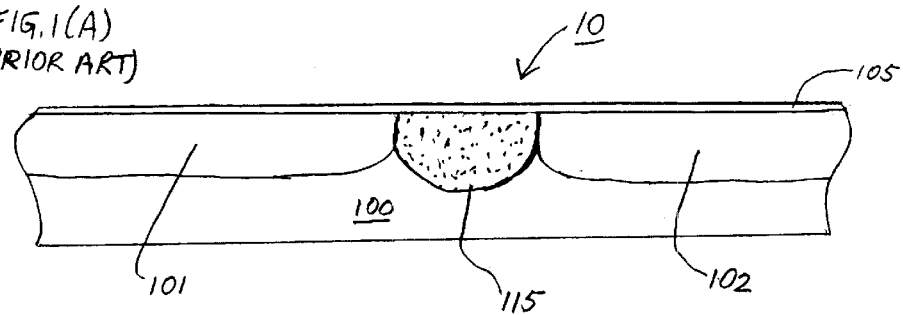
FIGS. 1(A)–1(H) illustrate, in simplified, cross-sectional schematic form, a conventional sequence of processing steps for forming CMOS devices.
Figure 2A:
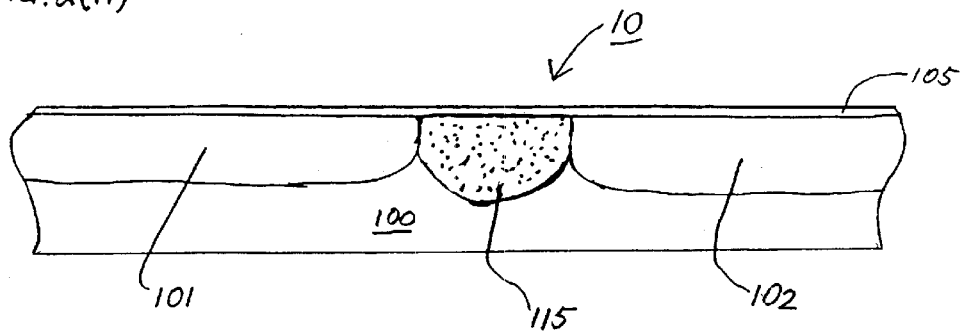
FIGS. 2(A)–2(G) illustrate, in simplified, cross-sectional schematic form, a sub-sequence of processing steps for forming plural MOS and CMOS semiconductor devices according to the method of the present invention.

More specifically, the inventive methodology is applicable to all manner of processing sequences for the formation of semiconductor devices including a plurality of active devices, e.g., MOS transistors and CMOS devices including NMOS and PMOS transistors, formed on or within a common semiconductor substrate, wherein, as part of the fabrication methodology, a preliminary structure 10 such as illustrated in FIGS. 1(A) or 2(A), or similar thereto, is formed which includes a plurality (e.g., a pair in the illustrated embodiment) of active device or transistor "precursor" regions 101, 102 electrically separated by field isolation region 115.

Figure 2B:
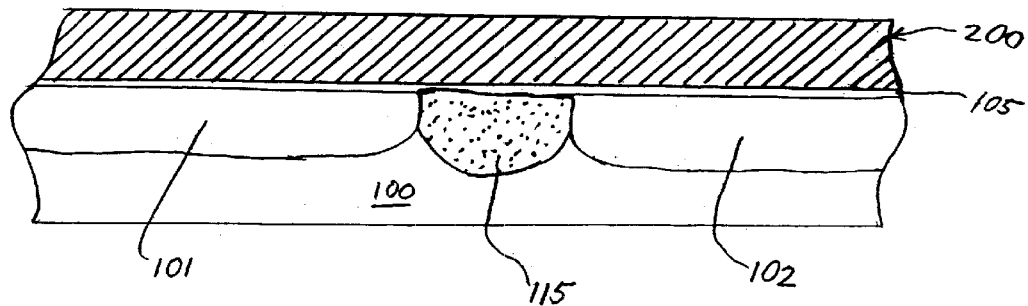

Referring now to FIG. 2(B), according to the invention, a first blanket layer 200 of a first metal having a thickness of from about 1,000 to about 3,000 Å is deposited over the thin gate insulator layer 105, typically a silicon oxide layer from about 15 to about 30 Å thick, formed on the upper surface of substrate 100, as by a suitable low energy deposition process, such as chemical vapor deposition ("CVD"), which does not materially damage the thin gate insulator layer 105. Metals typically utilized for forming the first blanket layer 200 include Mo, W, Ti, Pt, and Al.

Figure 2C:
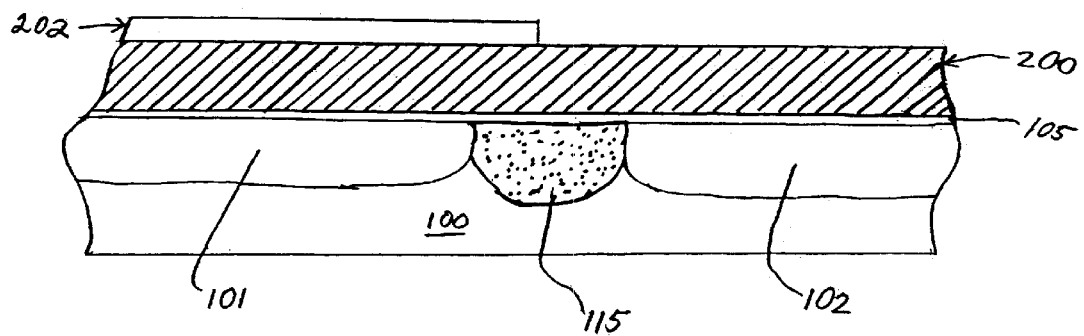

Adverting to FIG. 2(C), in a next step according to the invention, a layer of a hard mask material, typically a layer of $SiO_2$, $Si_3N_4$, or SiC from about 100 to about 500 Å thick is deposited over the first blanket layer 200 of first metal, e.g., by means of a conventional CVD or PVD technique and patterned, as by use of conventional photolithographic masking and etching techniques, to form a masking layer segment 202 overlying a selected one of the MOS transistor precursor regions 101, 102, illustratively NMOS precursor region 101.

Figure 2D:
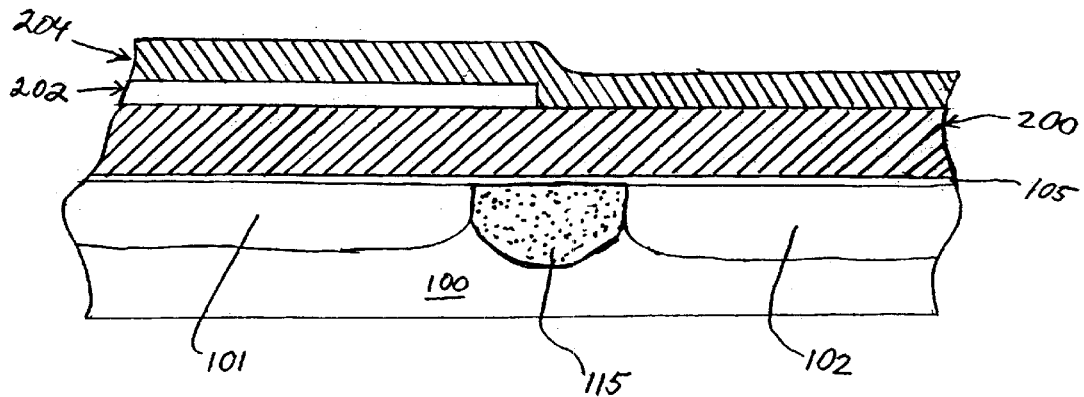
Figure 2E:
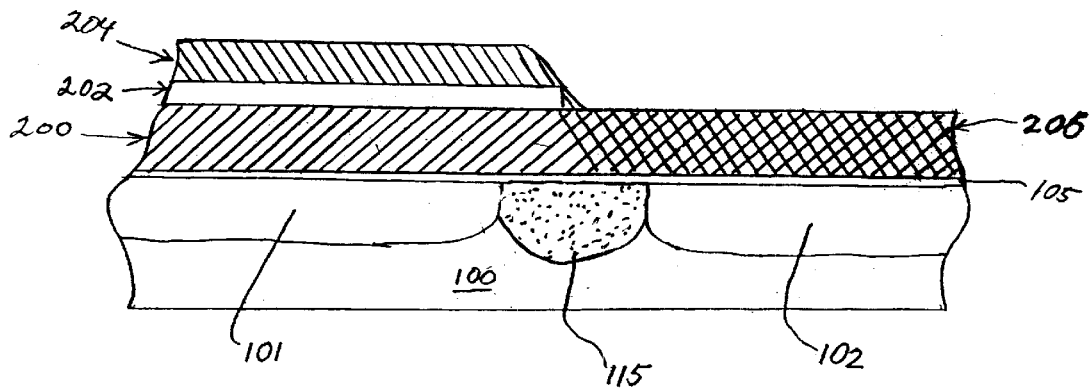

Referring now to FIGS. 2(D)–2(E), a second blanket layer 204 of a second metal or semi-metal, selected from elements in Groups IIA–VIA, IB, IIIB–VIIIB of the Periodic Table and lanthanide series elements, or of silicon (Si), is deposited over the upper surface of the thus-formed structure, as by any suitable technique, e.g., CVD, LPCVD, PVD, etc., and then subjected to a thermal treatment at an elevated temperature in an inert atmosphere for effecting alloying or silicidation reaction between the first and second blanket layers 200, 204, respectively, where they are in overlying contact, e.g., to selectively form a metal alloy or metal silicide layer 206 at the PMOS transistor precursor region 102 in the illustrated example. Preferably, a significant fraction of the thickness of the second blanket layer 204 is consumed during the formation of the metal alloy or metal silicide layer 206. The thickness of the second blanket layer 204 for use in a particular situation or application is determined, in the case where first and second metals are utilized for the first and second blanket layers, inter alia, on the basis of the particular first and second metals utilized for the first and second blanket layers and the specific alloy composition desired to be formed; and in the case where a first metal blanket layer and a Si second blanket layer are utilized, inter alia, on the basis of the particular metal and its Si consumption ratio. Similarly, the alloying or silicidation reaction conditions for use in a particular situation are determined, inter alia, on the basis of the particular pair of materials utilized for the first and second blanket layers.

By way of illustration only, according to the invention, a first blanket layer 200 of Al from about 1,000 to about 3,000 Å thick may be alloyed for a substantial fraction of the thickness thereof with a second blanket layer 204 of Ti from about 300 to about 1,000 Å thick by thermal treatment in an inert atmosphere at a temperature of from about 250 to about 400° C. for from about 10 to about 20 min. to form a $Ti-Al_3$ alloy. Similarly, by way of illustration only, according to the present invention, a first blanket layer 200 of Pt from about 1,000 to about 3,000 Å thick may be silicided for a substantial fraction of the thickness thereof with a second blanket layer 204 of Si from about 300 to about 1,000 Å thick by thermal treatment in an inert atmosphere at a temperature of from about 200 to about 500° C. for from about 10 to about 30 min.

Figure 1B:
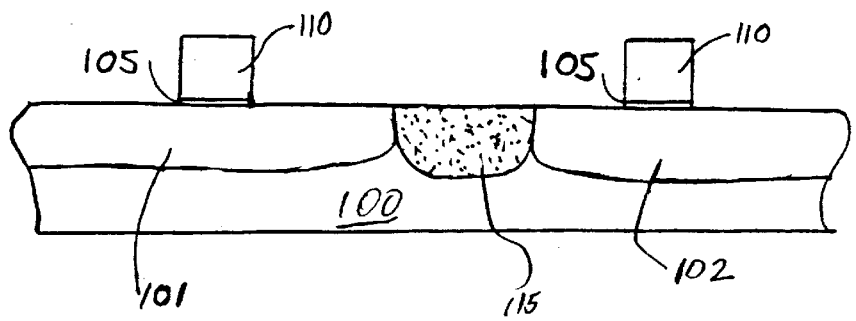
Figure 1C:
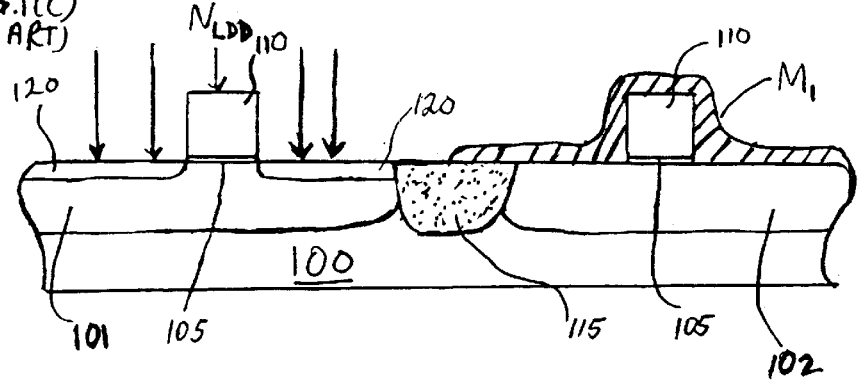
Figure 1D:
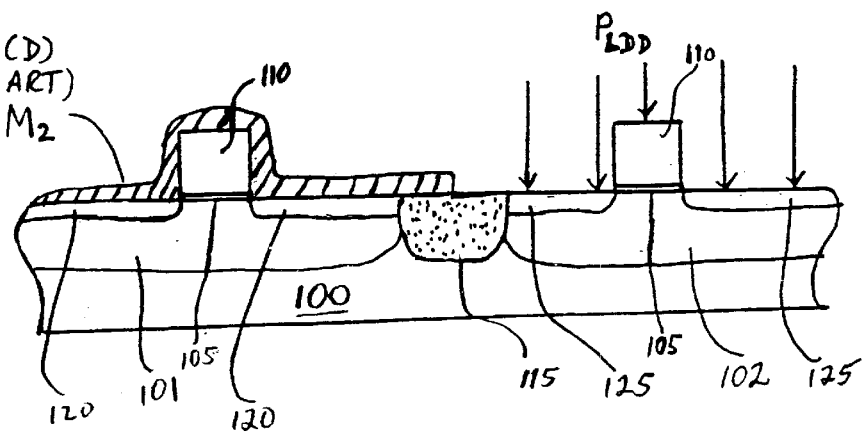
Figure 1E:
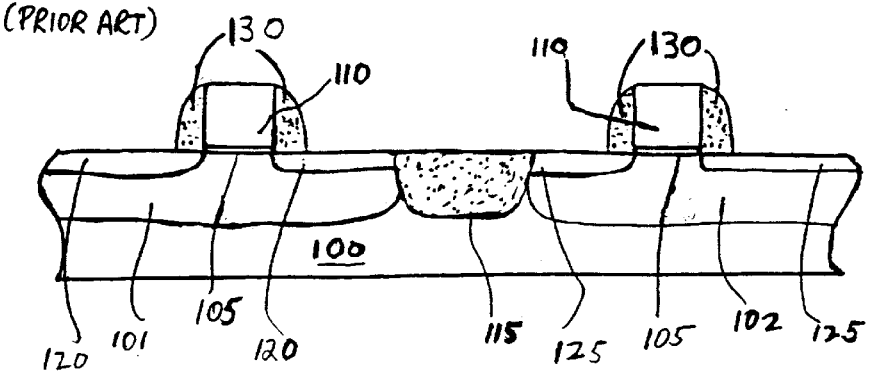
Figure 1F:
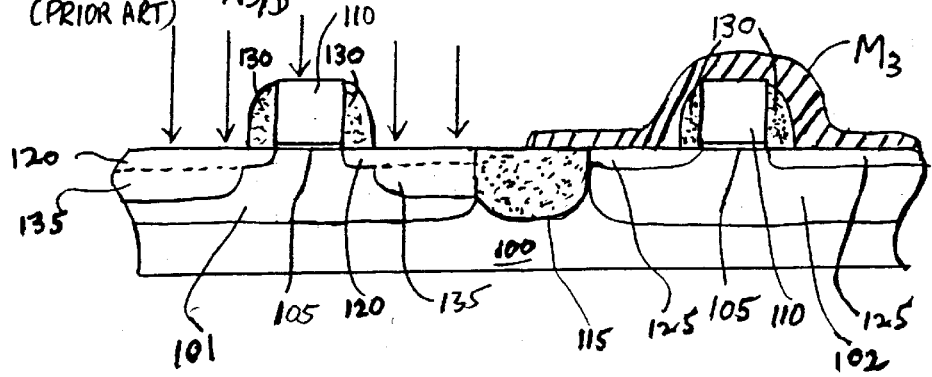
Figure 1G:
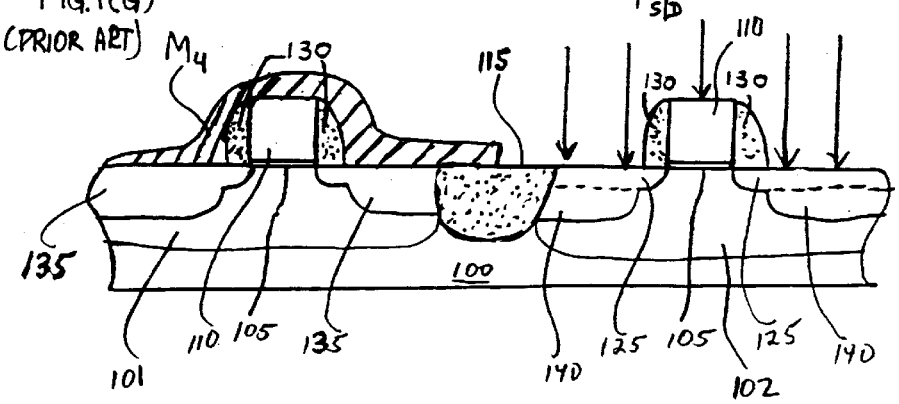
Figure 1H:
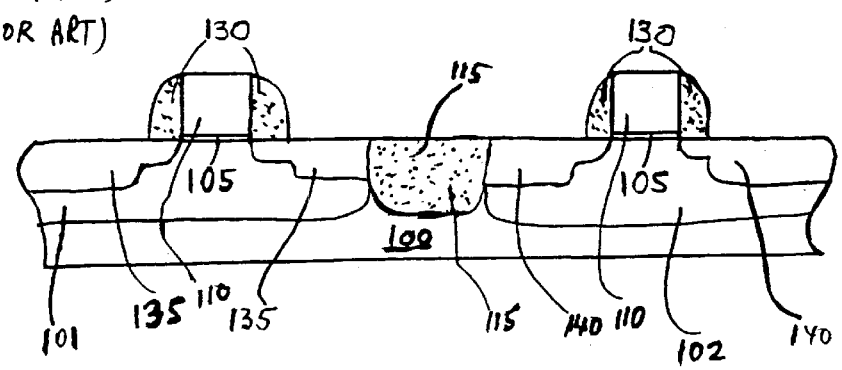
Figure 2F:
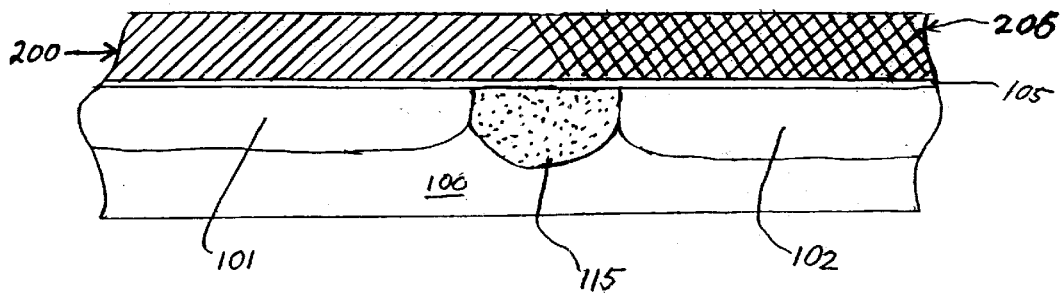
Figure 2G:
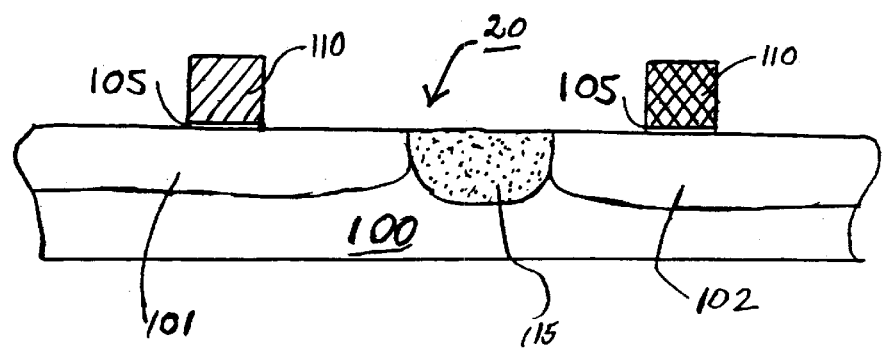

With reference to FIG. 2(F), according to the inventive methodology, the masking layer segment 202 overlying the unalloyed/unsilicided portion of the first blanket layer 200 in contact with the NMOS precursor region 101 is first exposed by means of a suitable blanket etch determined by the particular material to be removed, such as, for example, reactive plasma etching utilizing $CF_4$, $O_2$, and then selectively removed by means of a suitable technique selected on the basis of the particular material to be removed, e.g., reactive plasma etching, wet chemical etching, or electrolytic etching. Following removal of the masking layer segment 202, simultaneous patterning of the unalloyed portion of the first blanket layer 200 of first metal in contact with the underlying NMOS precursor region 101 and the alloyed or silicided portion 206 of the first blanket layer of first metal is performed utilizing conventional photolithographic masking and etching techniques to form the structure 20 shown in FIG. 2(G). Structure 20 is analogous to that formed according to the above-described conventional processing sequence and shown in FIG. 1(B); however, each of the gate electrodes 110 is formed of a different metal-based material, i.e., a first metal in electrical contact with the NMOS precursor region 101 and an alloy of the first metal with a second metal or an electrically conductive silicide of the first metal in electrical contact with the PMOS precursor region 102. Structure 20 of FIG. 2(G) may then receive further processing, e.g., source/drain formation, analogous to that shown in FIGS. 1(C)–1(H) to form a plural MOS transistor-containing device, as for example, the illustrated CMOS device composed of NMOS and PMOS transistors.

It should be recognized that the sequence of processing steps shown in FIGS. 2(A)–2(G) is not limited to use according to the illustrated example wherein a dual transistor structure is formed, but rather the inventive methodology may be readily adapted and utilized for forming various other MOS and CMOS structures and devices comprising a large plurality of MOS transistors.

As a consequence of the above-described inventive methodology, high- quality, submicron-dimensioned semiconductor devices, such as plural transistor-containing MOS transistor and CMOS devices including metal-based gate electrodes of different compositions may be advantageously formed with carefully and precisely tailored transistor characteristics for use in particular applications. In addition, the inventive methodology enjoys utility in the manufacture of various other semiconductor devices requiring in-laid metal gate electrodes of different compositions. Moreover, the invention can be practiced by use of conventional technologies and instrumentalities at rates consistent with the throughput requirements of automated manufacturing processes and is fully compatible with conventional process flow for the manufacture of high-density integration semiconductor devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present invention. It is to be understood that the present invention is capable of use in various other combinations and environments and is susceptible of changes or modifications within the scope of the inventive concept as expressed herein.

What is claimed is:

1. A method of manufacturing a semiconductor device including at least two metal-based gate electrodes of different composition, comprising the steps of:
  (a) providing a semiconductor substrate having a surface;
  (b) defining at least first and second spaced-apart, electrically isolated, active device precursor regions on or within said surface of said semiconductor substrate;
  (c) forming a first metal-based gate electrode in overlying electrical contact with said first active device precursor region, said first metal-based gate electrode comprised of a first metal; and
  (d) forming a second metal-based gate electrode in electrical contact with said second active device precursor region, said second metal-based gate electrode comprised of an alloy of said first metal with a second metal or semi-metal, or of an electrically conductive silicide of said first metal.

2. The method as in claim 1, wherein:
step (b) comprises defining transistor precursor regions.

3. The method as in claim 2, wherein:
step (b) comprises defining transistor precursor regions of different conductivity type.

4. The method as in claim 3, wherein:
step (b) comprises defining NMOS and PMOS transistor precursor regions.

5. The method as in claim 4, wherein:
step (b) comprises defining a precursor structure for a CMOS device.

6. The method as in claim 1, wherein:
step (d) comprises forming an alloy of said first metal with said second metal or semi-metal.

7. The method as in claim 1, wherein:
step (d) comprises forming a silicide of said first metal.

8. The method as in claim 1, wherein:
step (c) comprises forming said first metal-based gate electrode from a first metal selected from the group consisting of molybdenum (Mo), tungsten (W), titanium (Ti), platinum (Pt), and aluminum (Al); and
step (d) comprises forming said second metal-based gate electrode from an alloy of said first metal with a said second metal or semi-metal selected from elements in Groups IIA–VIA, IB, IIIB–VIIIB of the Periodic Table and lanthanide series elements, or from a silicide of said first metal.

9. The method as in claim 1, wherein:
step (b) includes steps of:
  (i) forming at least one dielectric isolation region extending for a depth below said surface of said semiconductor substrate to define said at least first and second spaced-apart active device precursor regions; and
  (ii) forming a thin gate oxide layer on at least portions of said substrate surface corresponding to said at least first and second spaced-apart active device precursor regions;
step (c) includes steps of:
  (i) forming a first blanket layer of said first metal over said substrate surface in electrical contact with each of said first and second spaced-apart, active device precursor regions; and
  (ii) selectively forming a layer of a hard mask material on a portion of said first blanket layer of said first metal overlying said first active device precursor region; and
step (d) includes steps of:
  (i) forming a second blanket layer of a said second metal or semi-metal, or silicon (Si), overlying said second active device precursor region and said layer of hard mask material overlying said first active device precursor region; and
  (ii) effecting alloying or silicidation reaction of the portion of said second blanket layer in overlying contact with the portion of said first blanket layer in electrical contact with said second active device precursor region.

10. The method as in claim 9, further including the steps of:
  (e) removing unalloyed or unsilicided portions of said second blanket layer to expose said layer of hard mask material overlying said first active device precursor region;

(f) removing said layer of hard mask material to expose said first blanket layer of said first metal overlying said first active device precursor region; and (g) selectively removing the portions of said first blanket layer of said first metal overlying said first active device precursor region and the alloyed or silicided portions of said first blanket layer of said first metal overlying said second active device precursor region to form respective first and second metal-based gate electrodes of different composition.

11. The method as in claim 1, further including the step of:

(h) forming source and drain regions in each of said first and second active device precursor regions.

12. A method of manufacturing a Si-based semiconductor device comprised of at least first and second MOS transistors, said first MOS transistor including a first gate electrode comprised of a first metal and said second MOS transistor including a second gate electrode comprised of an alloy of said first metal with a second metal or semi-metal, or a silicide of said first metal, comprising the steps of:

(a) providing a Si-based substrate having a surface;

(b) defining on or within said substrate surface at least first and second spaced apart, electrically isolated, transistor precursor regions where said first and second MOS transistors are to be formed;

(c) forming a first blanket layer of said first metal over said substrate surface in electrical contact with each of said first and second spaced-apart, transistor precursor regions;

(d) selectively forming a layer of a hard mask material on a portion of said first blanket material overlying said first transistor precursor region;

(e) forming a second blanket layer of a second metal or semi-metal, or silicon (Si), overlying said second transistor precursor region and said layer of hard mask material overlying said first transistor precursor region;

(f) effecting alloying or silicidation reaction of the portion of said second blanket layer in overlying contact with the portion of said first blanket layer in electrical contact with said second transistor precursor region;

(g) removing unalloyed or unsilicided portions of said second blanket layer to expose said layer of hard mask material overlying said first transistor precursor region;

(h) removing said layer of hard mask material to expose said first blanket layer of said first metal overlying said first transistor precursor region;

(i) selectively removing portions of said first blanket layer of said first metal overlying said first transistor precursor region and the alloyed or silicided portions of said first blanket layer of said first metal overlying said second transistor precursor region to form respective first and second metal-based gates of different composition; and (j) forming a pair of source and drain regions in each of said first and second transistor precursor regions.

13. The method as in claim 12, wherein:

step (c) comprises forming said first blanket layer from a first metal selected from the group consisting of Mo, W, Ti, Pt, and Al; and step (e) comprises forming said second blanket layer from a said second metal or semi-metal selected from elements in Groups IIA–VIA, IB, IIIB–VIIIB of the Periodic Table and lanthanide series elements, or from Si.

14. The method as in claim 12, wherein:

step (b) comprises defining at least first and second transistor precursor regions of opposite conductivity type for forming therein NMOS and PMOS transistors of a CMOS device; and wherein said first metal and said second metal or semi-metal, or said first metal and Si, utilized in performing steps (c) and (e), respectively, are selected on the basis of the conductivity types of the first and second MOS transistors.

15. The method as in claim 12, wherein:

step (b) includes steps of:

(i) forming at least one dielectric isolation region extending for a depth below said surface of said Si-based semiconductor substrate to define said at least first and second spaced-apart transistor precursor regions; and (ii) forming a thin gate oxide layer on at least portions of said Si-based semiconductor substrate surface corresponding to said at least first and second spaced-apart transistor precursor regions.

16. The method as in claim 12, wherein:

step (j) comprises forming said pairs of source and drain regions in each of said transistor precursor regions by ion implantation of appropriate conductivity type dopant species.

17. A semiconductor device, comprising:

a semiconductor substrate including a surface having formed therein or thereon at least one first active device region and at least one second active device region, said first and second active device regions including respective first and second metal-based gate electrodes of different composition, said first metal-based gate electrode being comprised of a first metal and said second metal-based gate electrode being comprised of an alloy of said first metal with a second metal or semi-metal, or of an electrically conductive silicide of said first metal.

18. A semiconductor device according to claim 17, wherein:

said substrate is Si-based, said first active device region comprises a first conductivity type MOS transistor, said second active device region comprises a second, opposite conductivity type MOS transistor, and said semiconductor device is a CMOS device.

19. A semiconductor device according to claim 17, wherein:

said first metal-based gate electrode comprises a first metal selected from the group consisting of Mo, W, Ti, Pt, and Al; and said second metal-based gate electrode comprises an alloy of said first metal with a second metal or semi-metal selected from elements in Groups IIA–VIA, IB, IIIB–VIIIB of the Periodic Table and lanthanide series elements.

20. A semiconductor device according to claim 17, wherein:

said first metal-based gate electrode comprises a first metal selected from the group consisting of Mo, W, Ti, Pt, and Al; and said second metal-based gate electrode comprises a silicide of said first metal.

* * * * *